(12) United States Patent
Nangoy et al.

(10) Patent No.: US 9,162,236 B2
(45) Date of Patent: Oct. 20, 2015

(54) PROPORTIONAL AND UNIFORM CONTROLLED GAS FLOW DELIVERY FOR DRY PLASMA ETCH APPARATUS

(71) Applicant: Applied Materials, Inc., Santa Clara, CA (US)

(72) Inventors: Roy C. Nangoy, Santa Clara, CA (US); Andrew Nguyen, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 83 days.

(21) Appl. No.: 13/790,735

(22) Filed: Mar. 8, 2013

(65) Prior Publication Data

US 2013/0284700 A1 Oct. 31, 2013

Related U.S. Application Data

(60) Provisional application No. 61/638,847, filed on Apr. 26, 2012.

(51) Int. Cl.
*B05B 1/18* (2006.01)
*H01L 21/67* (2006.01)
(Continued)

(52) U.S. Cl.
CPC .............. *B05B 1/185* (2013.01); *B01F 15/0264* (2013.01); *C23C 16/45563* (2013.01);
(Continued)

(58) Field of Classification Search
CPC .... B01D 15/14; B01D 3/008; B01F 15/0264; B01F 15/0265; B01F 5/0601; B01F 2005/0002–2005/0005; B01F 2005/0008–2005/0011; B01F 2005/0028–2005/0031; B01F 2005/0088–2005/0091; B01F 5/064–5/0645; B01L 3/502784; B01L 2300/0861–2300/0883; B05B 1/185; C23C 16/455; C23C 16/45563–16/45578; C23C 16/45502–16/4551; G01N 30/6017; H01J 37/32119; H01J 37/32431; H01J 37/3244; H01J 37/32449; B01J 2204/002; B01J 2219/00788; B01J 2219/00792; B01J 2219/00797; B01J 2219/00799; B01J 2219/00855; B01J 2219/00894; B01J 2219/00903; B01J 2219/194; B01J 2219/1914–2219/1946; B01J 2219/1947–2219/1948; H01L 21/67069
USPC ........ 118/715, 723 I, 723 R, 733; 156/345.29, 156/345.33, 345.48
See application file for complete search history.

(56) References Cited

U.S. PATENT DOCUMENTS 5,792,272 A * 8/1998 van Os et al. ............. 118/723 R
5,958,140 A 9/1999 Arami
(Continued)

FOREIGN PATENT DOCUMENTS

KR 1997-0008335 A 2/1997
KR 2008-0054354 A 6/2008
WO WO 2012071661 A1 * 6/2012

OTHER PUBLICATIONS

International Search Report, PCT Application : PCT/US2013/035383, dated Jun. 28, 2013.

*Primary Examiner* — Jeffrie R Lund
*Assistant Examiner* — Stanislav Antolin
(74) *Attorney, Agent, or Firm* — Patterson & Sheridan, LLP

(57) ABSTRACT

Embodiments of the present invention relate to method and apparatus for providing processing gases to a process chamber with improved uniformity. One embodiment of the present invention provides a gas injection assembly. The gas injection assembly includes an inlet hub, a nozzle having a plurality of injection passages disposed against the inlet hub, and a distribution insert disposed between the nozzle and the inlet hub. The distribution insert has one or more gas distribution passages configured to connect the inlet hub to the plurality of the injection passages the nozzle. Each of the one or more gas distribution passages has one inlet connecting with a plurality of outlets, and distances between the inlet and each of the plurality of outlets are substantially equal.

20 Claims, 6 Drawing Sheets

(51) Int. Cl.
 *H01J 37/32* (2006.01)
 *C23C 16/455* (2006.01)
 *B01F 15/02* (2006.01)

(52) U.S. Cl.
 CPC ..... *C23C16/45565* (2013.01); *C23C 16/45578* (2013.01); *H01J 37/3244* (2013.01); *H01J 37/32449* (2013.01); *H01J 37/32119* (2013.01); *H01L 21/67069* (2013.01)

(56) References Cited

U.S. PATENT DOCUMENTS

| | | | | |
|---|---|---|---|---|
| 5,992,453 | A * | 11/1999 | Zimmer | 137/561 A |
| 6,079,355 | A * | 6/2000 | Lou et al. | 118/723 E |
| 6,245,192 | B1 * | 6/2001 | Dhindsa et al. | 156/345.34 |
| 7,685,965 | B1 * | 3/2010 | Hao et al. | 118/723 I |
| 2001/0047760 | A1 * | 12/2001 | Moslehi | 118/723 I |
| 2002/0078893 | A1 * | 6/2002 | Os et al. | 118/723 I |
| 2003/0070620 | A1 * | 4/2003 | Cooperberg et al. | 118/723 AN |
| 2004/0020439 | A1 * | 2/2004 | Chen et al. | 118/733 |
| 2004/0094090 | A1 * | 5/2004 | Stadel et al. | 118/715 |
| 2004/0099378 | A1 * | 5/2004 | Kim et al. | 156/345.33 |
| 2004/0140252 | A1 * | 7/2004 | Gebauer | 210/198.2 |
| 2006/0011298 | A1 * | 1/2006 | Lim et al. | 156/345.34 |
| 2006/0021568 | A1 * | 2/2006 | Matsumoto | 118/62 |
| 2008/0081114 | A1 * | 4/2008 | Johanson et al. | 427/273 |
| 2008/0083883 | A1 * | 4/2008 | Bogart et al. | 250/423 P |
| 2008/0178807 | A1 | 7/2008 | Wang et al. | |
| 2008/0206483 | A1 * | 8/2008 | Paterson et al. | 427/570 |
| 2008/0236490 | A1 * | 10/2008 | Paterson et al. | 118/723 I |
| 2009/0159213 | A1 * | 6/2009 | Bera et al. | 156/345.34 |
| 2009/0159424 | A1 * | 6/2009 | Liu et al. | 204/164 |
| 2009/0162260 | A1 * | 6/2009 | Bera et al. | 422/186.04 |
| 2009/0162261 | A1 * | 6/2009 | Baera et al. | 422/186.04 |
| 2009/0162262 | A1 * | 6/2009 | Bera et al. | 422/186.04 |
| 2009/0272492 | A1 * | 11/2009 | Katz et al. | 156/345.34 |
| 2011/0162800 | A1 * | 7/2011 | Noorbakhsh et al. | 156/345.34 |
| 2013/0109159 | A1 * | 5/2013 | Carlson | 438/503 |

* cited by examiner

PROPORTIONAL AND UNIFORM CONTROLLED GAS FLOW DELIVERY FOR DRY PLASMA ETCH APPARATUS

CROSS-REFERENCE TO RELATED APPLICATIONS

This application claims benefit of U.S. Provisional Patent Application Ser. No. 61/638,847 filed Apr. 26, 2012, which is herein incorporated by reference.

BACKGROUND

1. Field

Embodiments of the present invention generally relate a substrate processing system and related substrate process. More particularly, embodiments of the present invention relate to method and apparatus for providing processing gases to a process chamber with improved uniformity.

2. Description of the Related Art

During manufacturing of microelectronic devices, inductively coupled plasma reactors are used in various processes. Conventional inductively coupled plasma reactors generally includes a vacuum chamber having a side wall and a ceiling, a workpiece support pedestal within the chamber and generally facing the ceiling, a gas inlet capable of supplying one or more processing gases into the chamber, and one or more coil antennas overlying the ceiling. A gas inlet generally includes one or more gas lines coupled to a nozzle with a plurality of injection outlets. The gas lines are usually connected to the nozzle from one side in a non-symmetrical manner. The non-symmetrical connection of the gas lines causes a skew in the distribution of processing gas from the nozzle resulting in non-uniform processing.

Therefore, there is a need for apparatus and methods for delivering processing gas with improved uniformity.

SUMMARY

Embodiments of the present invention generally relate a substrate processing system and related substrate process. More particularly, embodiments of the present invention relate to method and apparatus for providing processing gases to a process chamber with improved uniformity.

One embodiment of the present invention provides a gas injection assembly. The gas injection assembly includes an inlet hub, a nozzle having a plurality of injection passages disposed against the inlet hub, and a distribution insert disposed between the nozzle and the inlet hub. The distribution insert has one or more gas distribution passages configured to connect the inlet hub to the plurality of the injection passages the nozzle. Each of the one or more gas distribution passages has one inlet connecting with a plurality of outlets, and distances between the inlet and each of the plurality of outlets are substantially equal.

Another embodiment of the present invention provides a substrate processing system. The substrate processing system includes a chamber housing assembly defining a processing volume, and a substrate support disposed in the processing volume. The chamber housing assembly comprises a chamber lid having a central opening. The substrate processing system further includes a gas injection assembly disposed over the chamber lid. A portion of the nozzle is positioned in the processing volume through the central opening in the chamber lid. The gas injection assembly includes an inlet hub, a nozzle having a plurality of injection passages disposed against the inlet hub, and a distribution insert disposed between the nozzle and the inlet hub. The distribution insert has one or more gas distribution passages configured to connect the inlet hub to the plurality of the injection passages the nozzle. Each of the one or more gas distribution passages has one inlet connecting with a plurality of outlets, and distances between the inlet and each of the plurality of outlets are substantially equal.

Yet another embodiment of the present invention provides a method for processing a substrate. The method includes positioning a substrate in a substrate processing system, and providing one or more processing gas through a gas injection assembly of the substrate processing system. The gas injection assembly includes an inlet hub, a nozzle having a plurality of injection passages disposed against the inlet hub, and a distribution insert disposed between the nozzle and the inlet hub. The distribution insert has one or more gas distribution passages configured to connect the inlet hub to the plurality of the injection passages the nozzle. Each of the one or more gas distribution passages has one inlet connecting with a plurality of outlets, and distances between the inlet and each of the plurality of outlets are substantially equal.

BRIEF DESCRIPTION OF THE DRAWINGS

So that the manner in which the above recited features of embodiments of the present invention can be understood in detail, a more particular description of embodiments of the present invention, briefly summarized above, may be had by reference to embodiments, some of which are illustrated in the appended drawings. It is to be noted, however, that the appended drawings illustrate only typical embodiments of this invention and are therefore not to be considered limiting of its scope.

To facilitate understanding, identical reference numerals have been used, where possible, to designate identical elements that are common to the figures. It is contemplated that elements disclosed in one embodiment may be beneficially utilized on other embodiments without specific recitation

DETAILED DESCRIPTION

Embodiments of the present invention generally relate to method and apparatus for providing processing gases to a process chamber with improved uniformity. More particularly, embodiments of the present invention provide a gas injection assembly including an inlet hub for receiving one or more gases from a source, a nozzle for injecting the one or more gases to a processing chamber through a plurality of injection passages and a distribution insert between the input hub and the nozzle.

The distribution insert provides distribution passages connecting the inlet hub to the plurality of injection passages in the nozzle so that distances from the plurality of injection passages and the inlet hub are substantially equal. The distribution insert positions each of the plurality of injection passages in the nozzle at equal distance from the inlet hub even if the inlet hub is not symmetrically located relative to the plurality of injection passage, thereby, improving gas injection uniformity.

According to one embodiment of the present invention, the nozzle, the distribution insert, and the inlet hub remain separate without being joined by any physical components, such as welding, fasteners. During operation, the nozzle and the inlet hub may be pressed against each other by difference in pressure between inside and outside the processing chamber to create air tight structure. In one embodiment, a springing element may be included to bias the distribution insert against the inlet hub to form the distribution passages. By eliminating the need of permanent joints, the gas injection nozzle may be fabricated from ceramics at reasonable costs.

In one embodiment, the gas injection assembly includes an observation window. The observation window may be disposed over a central opening of the nozzle. The observation allows an optical sensor to monitor a substrate in the processing chamber, therefore, improving controllability.

Figure 1:
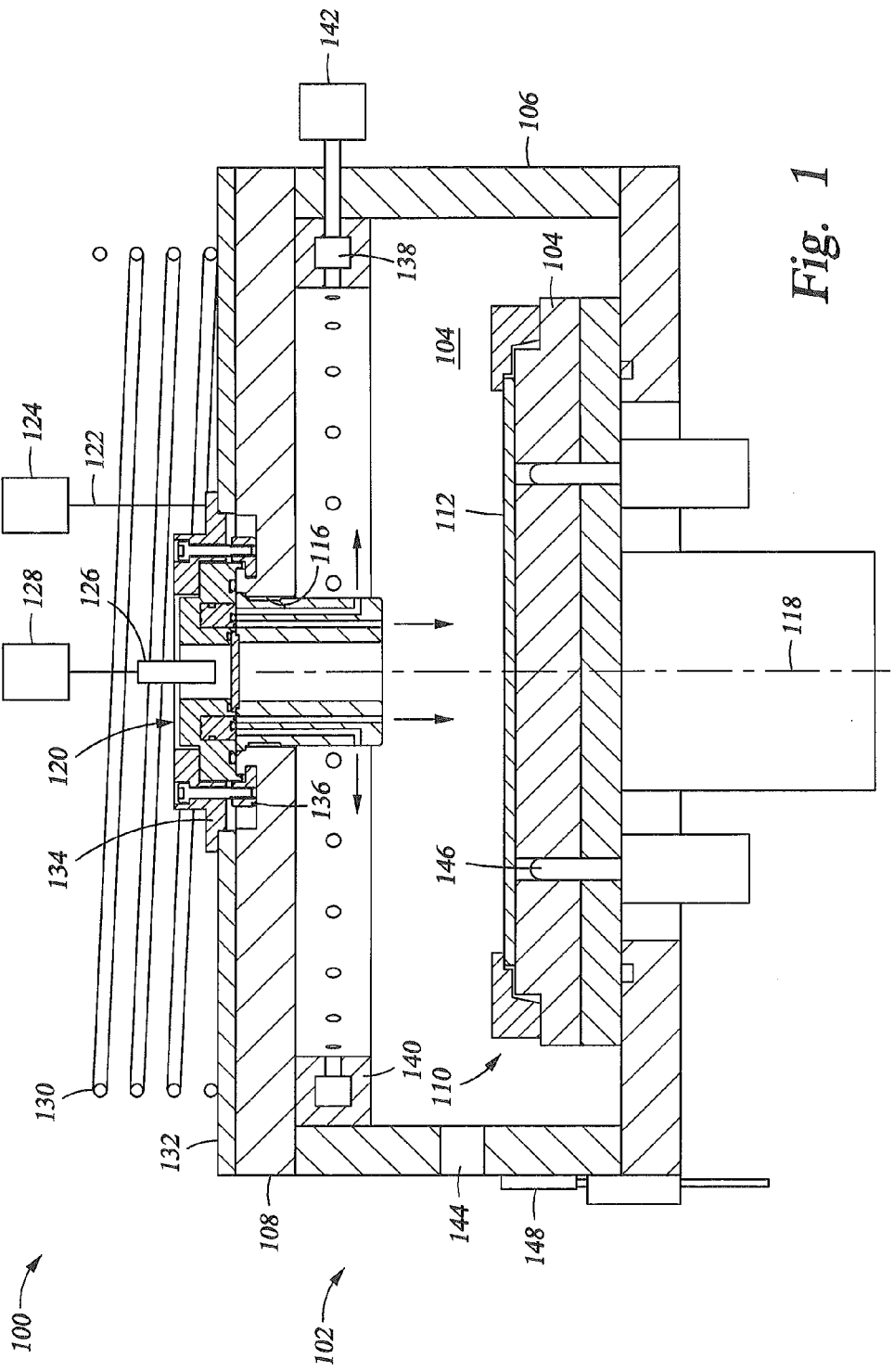
FIG. 1 schematically illustrates a plasma processing system according to one embodiment of the invention.

FIG. 1 schematically illustrates a sectional view of a substrate processing system 100, for processing a variety of substrates and accommodating a variety of substrate sizes, for example a substrate diameter of up to about 450 mm. The substrate processing system 100 comprise a chamber housing assembly 102 having a processing volume 104 defined therein. The chamber housing assembly 102 may include sidewalls 106 and a chamber lid 108. A substrate support assembly 110 may be disposed in the processing volume 104. The substrate support assembly 110 supports a substrate 112 during processing. A slit valve opening 144 may be formed to through the chamber wall 106 to allow substrates in and out the processing volume 104. A slit valve door 148 may be used to selectively close the slit valve opening 144. A plurality of lift pins 146 may be used to pick up and drop off the substrate 112 during substrate exchange. In one embodiment, the substrate support assembly 110 may include an electrostatic chuck 104 for securing the substrate 112 during processing.

The chamber lid 108 has an opening 116 to allow entrance of one or more processing gases. The opening 116 may be a central opening located near a center axial 118 of the substrate processing system 100 and correspond to a center of the substrate 112 being processed.

A gas injection assembly 120 is disposed over the chamber lid 108 through the opening 116. The gas inject assembly 120 may be connected to a gas source 124 through one or more gas input lines 122 to supply one or more processing gases to the processing volume 104. In one embodiment, the one or more processing gases may exit the processing volume 104 via a pumping channel 138 formed in a liner 140 disposed inside the processing volume 104. The pumping channel 138 may be in fluid communication with a vacuum pump 142. Alternatively, the vacuum pump 142 may be connected to the processing volume 104 directly.

A sensor 126 may be disposed over the chamber lid 104 and configured to monitor the substrate 112 in the processing volume 104 through the gas injection assembly 120. The sensor 126 may be connected to a system controller 128 to provide feedback for process control.

Optionally, the substrate processing system 100 may include an antenna assembly 130 disposed over the chamber lid 108. The antenna assembly 130 is configured to generate plasma in the processing volume 104. The antenna assembly 130 may include one or more solenoidal interleaved coil antennas disposed coaxial with the central axis 118 of the substrate processing system 100. A heater assembly 132 may be disposed over the chamber lid 108. The heater assembly 132 may be secured to the chamber lid 108 by clamping members 134, 136.

Figure 2A:
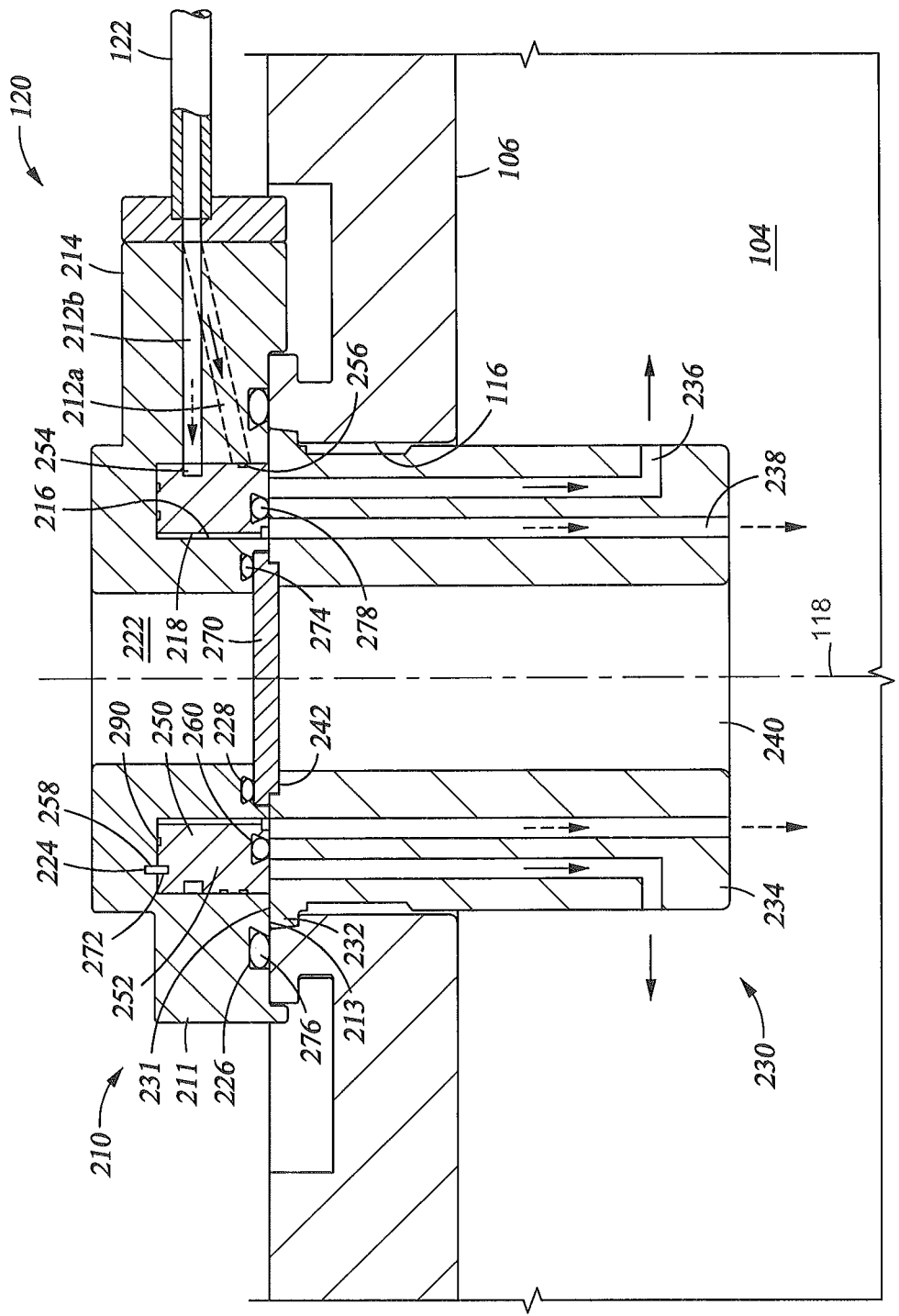
FIG. 2A is an enlarged sectional view of a gas injection assembly according to one embodiment of the invention.

The gas injection assembly 120 is configured to supply one or more processing gases to the processing volume 104 in a uniform manner. FIG. 2A is an enlarged sectional view of the gas injection assembly 120 disposed on the chamber lid 106 with the clamping members 134, 136 and the heater assembly 132 removed.

As shown in FIG. 2A, the gas injection assembly 120 includes an inlet hub 210, a nozzle 230 and a distribution insert 250. When assembled, the nozzle 230 is disposed through in the opening 116 of the chamber lid 106. The nozzle 230 may have a flange 232 for mounting the nozzle 230 on the chamber lid 106. A portion of the nozzle 230 protrudes into the processing volume 104 through the opening 116 to deliver processing gas to the processing volume 104. The input hub 210 is positioned on the chamber lid 106 covering the opening 116 and the nozzle 230. The inlet hub 210 is disposed over the nozzle 230 and provides an interface between the gas input lines 122 and the nozzle 230. The distribution insert 250 is disposed in an inner volume 218 of the inlet hub 210. The distribution insert 250 provides one or more distribution passages routing the one or more gases from the gas input lines 122 to the nozzle 230.

The inlet hub 210 has a body 211 shaped to enclose the opening 116 and interface with the nozzle 230. The body 211 has an outer surface 214 facing the exterior environment, an inner surface 216 defining the inner volume 218, and a bottom surface 213 for contacting with the nozzle 230 and the chamber lid 106. One or more inlet passages 212a, 212b are formed through the body 211. Each inlet passage 212a, 212b has a first end open to the outer surface 214 and a second end open to the inner volume 218. The one or more inlet passages 212a, 212b are adapted to connect with the one or more gas input lines 122. For clarity reasons, the inlet passage 212b is shown in the sectional view of FIG. 2A even though the inlet passage 212b may not be positioned on the sectional line. In one embodiment, the one or more inlet passages 212a, 212b are non-symmetrical relative to the central axis 118. The inner volume 218 has an opening 220 at the bottom surface 213. The opening 220 connects the inner volume 218 with the nozzle 230.

The inlet hub 210 may be shaped to connect with the nozzle 230 and cover the opening 116 in the chamber lid 106. In one embodiment, the body 211 of the inlet hub 210 is substantially circular. A gland 226 surrounding the opening 220 of the inner volume 218 may be formed in the bottom surface 213 of the inlet hub 210 to receive a seal 276. When assembled, the gland 226 and the seal 276 also surround the opening 116 of the chamber lid 106 and the seal 276 contacts the chamber lid 106 to form an air tight seal between the processing volume 104 and the exterior environment.

The nozzle 230 has an upper surface 231 for contacting with the bottom surface 213 of the inlet hub 210. The nozzle 238 may has a plurality of injection passages 236, 238 for injecting one or more processing gas from the inner volume 218 of inlet hub 210. Each of the plurality of injection passages 236, 238 has an inlet at the upper surface 231. The injection passages 236, 238 may have outlets at various positions to achieve desired gas injecting effect. In one embodiment, as shown in FIG. 2A, the plurality of injection passages 236 are arranged radially outward of the plurality of injection passages 236. The plurality of injection passages 236 have outlets directed radially outward from the nozzle 230. The plurality of injection passages 238 have outlets directed downward from the nozzle 230. In one embodiment, the nozzle 230 may be cylindrical and the plurality of injection passages 236, 238 are evenly distributed in azimuthal orientation.

The distribution insert 250 is disposed within the inner volume 218 of the inlet hub 210. The distribution insert 250 has one or more distribution passages 254, 256 configured to connect the inlet passages 212a, 212b to the plurality of injection passages 236, 238. In one embodiment, each of the one or more distribution passages 254, 256 has one inlet and a plurality of outlets, and distances between the inlet and each of the plurality outlets are substantially equal. By providing distribution passages of substantially equal length to each injection passages 236, 238, the distribution insert 250 insures that processing gas reaches individual injection passages 236, 238 at substantially identical condition regardless the position of the individual injection passages 236, 238 relative to the inlet passages 212a, 212b, therefore, improving azimuthal injection uniformity from the nozzle 230.

In one embodiment, the distribution insert 250 includes a solid body 252 having a plurality of grooves 290 formed thereon. The one or more distribution passages 254, 256 are defined by the plurality of grooves 290 on the solid body 252 of the distribution insert 250 and the inner surface 216 of the inlet hub 210, as shown in FIG. 2A. A springing element may be used to press the distribution insert 250 against the inner surface 216 of the inlet hub 210 to form the distribution passages 254, 256. In one embodiment, a seal 278 disposed on a gland 260 may be used as the springing element. The seal 278 is pressed between the distribution insert 250 and the nozzle 230 to apply a springing force against the inlet hub 210. The gland 260 may be formed deeper than a gland according to design requirement for the seal 278 to form a vacuum seal so that the spring force from the seal 278 does not compromise the vacuum seal formed by the O-ring seal 276. In one embodiment, the seal 278 may be compressed to reduce about 10% to about 20% of its original size.

Alternatively, the distribution insert 250 may include distribution passages entirely or partially made of internal channels.

As shown in FIG. 2A, the gas injection assembly 120 is configured to receive and inject gas from two independent gas sources. Each of the inlet passages 212a, 212b may be adapted to receive one source line. As shown in FIG. 2A, the distribution passage 254 connects the inlet passage 212b to the plurality of injection passages 238 and form fluid paths illustrated by dotted arrows. The distances from exit of the inlet passage 212b to exit of each of the plurality of injection passages 238 are substantially equal. Thus, a processing gas from the inlet passage 212b may be injected to the processing volume 104 through the plurality of injection passages 238 in a uniform manner. The distribution passages 256 connect the inlet passage 212a to the plurality of injection passages 236 and form fluid paths illustrated by solid arrows. The distances from exit of the inlet passage 212a to exit of each of the plurality of injection passages 236 are substantially equal. Thus, a processing gas from the inlet passage 212a may be injected to the processing volume 104 through the plurality of injection passages 236 in a uniform manner. Alternatively, the gas injection assembly 120 may include more or less independent paths.

An alignment element may used to align the distribution insert 250 and the inlet hub 210 so that the inlet passages 212a, 212b align with a corresponding distribution passage 254, 256 in the distribution insert 250. In one embodiment, the inlet hub 210 has an aligning hole 224, the distribution insert 250 has an aligning hole 258, and a dowel pin 272 threads between the aligning hole 224 in the inlet hub 210 and the aligning hole 258 in the distribution insert 250. Alternatively, other alignment element, such as teeth and grooves, may be used.

Optionally, the gas injection assembly 120 includes an observation window 270. The body 211 of the inlet hub 210 may have a through hole 222 and the inner volume 218 may be a ring-shaped recess radially outward from the through hole 222. The nozzle 230 may be a hollow cylinder having a central opening 240 and the plurality of injection passages 236, 238 may be formed through sidewall of the hollow cylinder. The observation window 270 may be disposed between the inlet hub 210 and the nozzle 230. In one embodiment, the nozzle 230 may have a recess 242 for supporting the observation window 270. The inlet hub 210 may have a gland 228 formed to receive a seal 274 to provide a vacuum seal between the inlet hub 210 and the observation window 270. In one embodiment, the observation window 270 is fabricated from quartz.

Figure 2B:
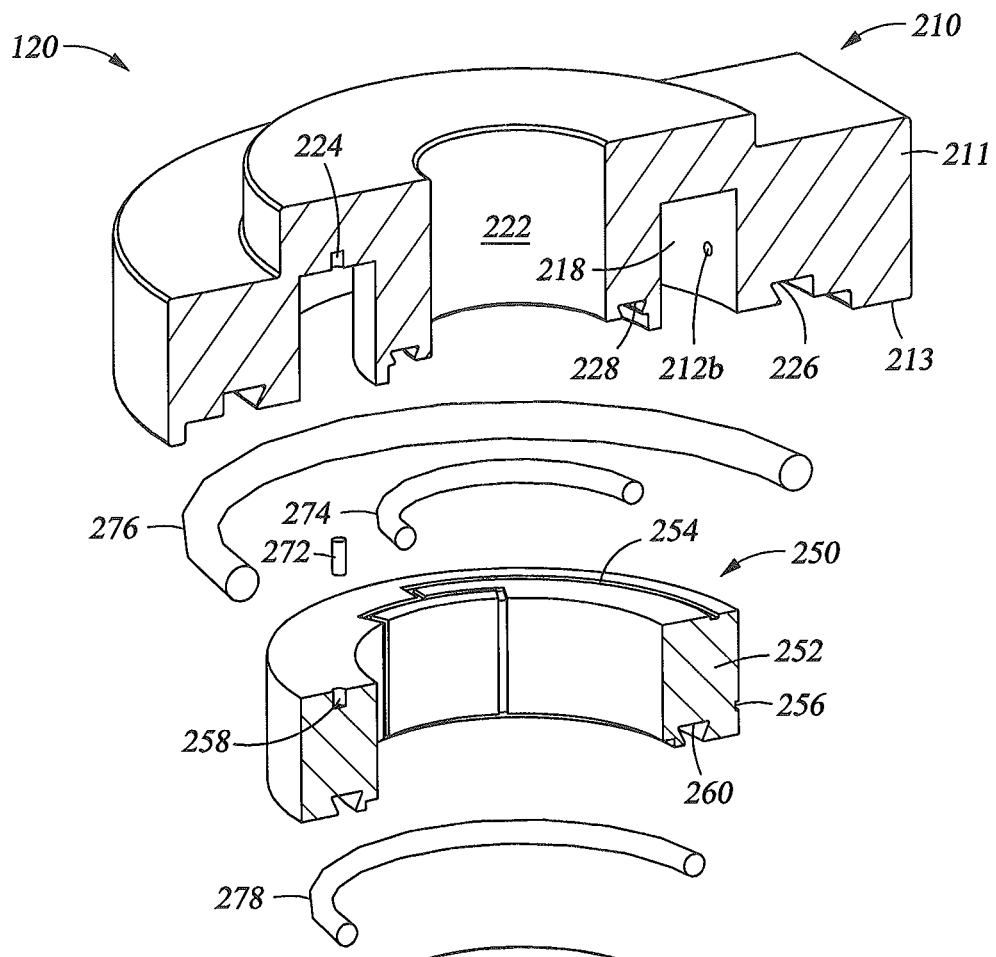
FIG. 2B is an exploded view of the gas injection assembly of FIG. 2A.
Figure 2B:
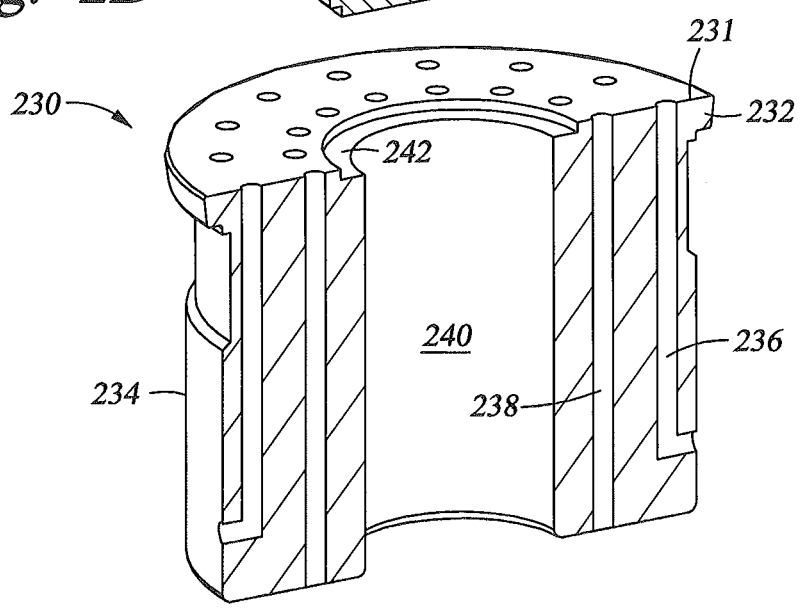

FIG. 2B is an exploded view of the gas injection assembly 210 of FIG. 2A. The inlet hub 210, the nozzle 230 and the distribution insert 250 remain as separate components and are not permanently joined together. The inlet hub 210, the nozzle 230 and the distribution insert 250 may be fabricated from ceramic material, such as aluminum oxide.

Figure 3A:
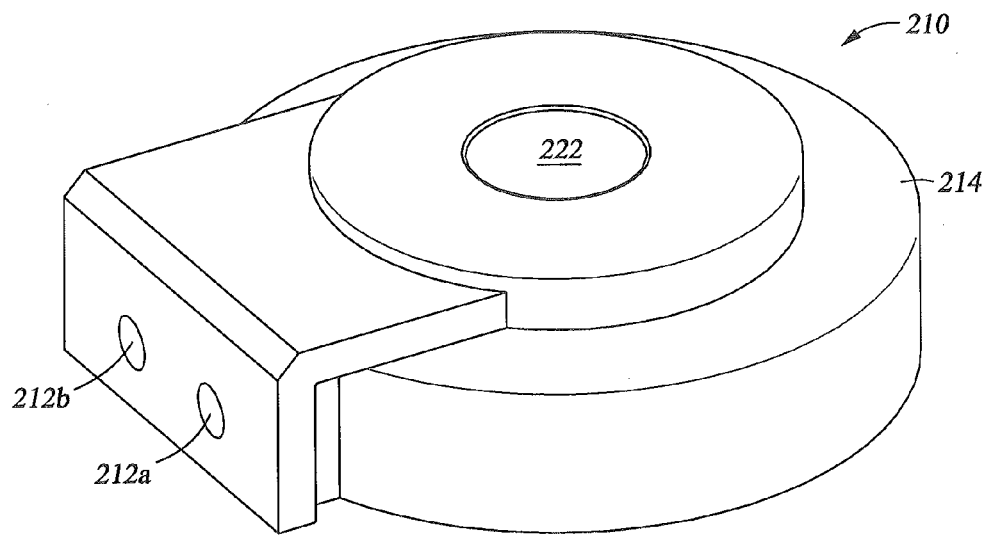
FIG. 3A is a schematic top perspective view of a gas hub according to one embodiment of the present invention.
Figure 3B:
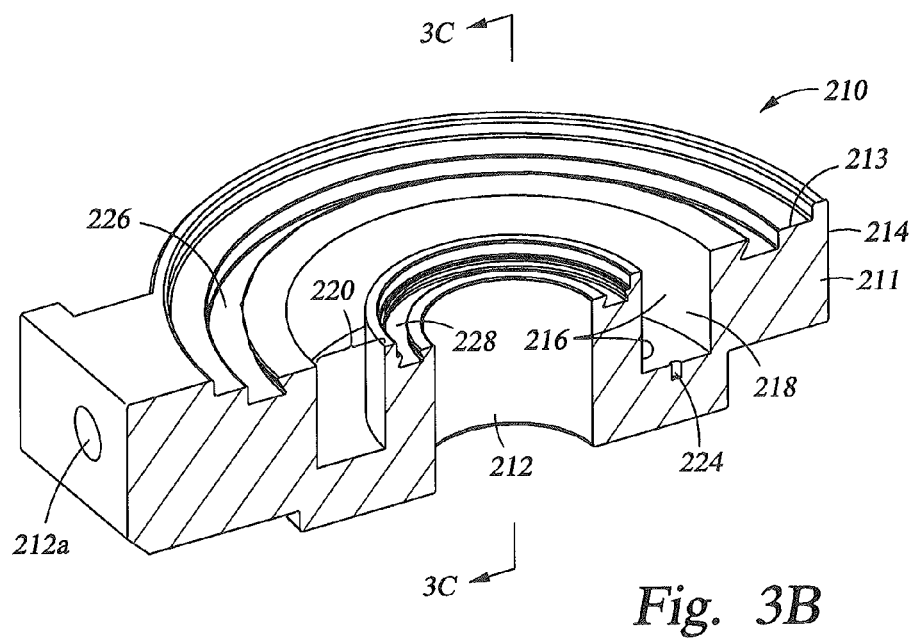
FIG. 3B is a schematic sectional perspective view of the gas hub of FIG. 3A.

FIG. 3A is a schematic perspective view of the inlet hub 210 according to one embodiment of the present invention. FIG. 3B is a schematic sectional perspective view of the inlet hub 210. The inlet passages 212a, 212b may be formed from one side of the body 211 and entering the inner volume 218 non-symmetrically.

Figure 3C:
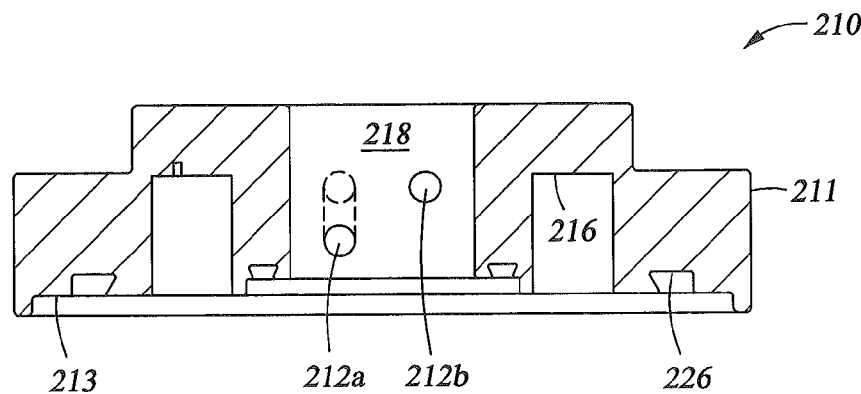
FIG. 3C is a sectional side view showing gas paths in the gas hub of FIG. 3A.

FIG. 3C is a sectional side view showing inlet passages 212a, 212b in the inlet hub 210. As shown in FIG. 3C, the inlet passages 212a, 212b may enter the inner volume 218 of the inlet hub 210 at different vertical levels.

Figure 4:
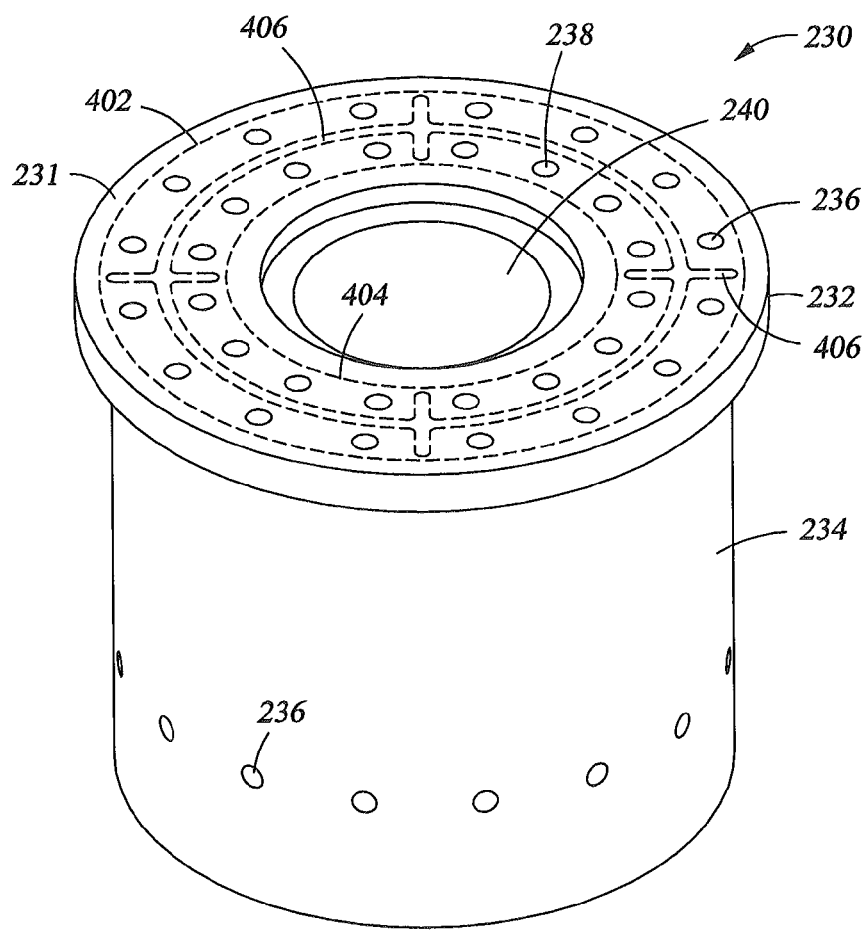
FIG. 4 is a schematic top perspective view of a nozzle insert according to one embodiment of the present invention.

FIG. 4 is a schematic perspective view of the nozzle insert 230 according to one embodiment of the present invention. The plurality of injection passages 236, 238 are evenly distributed along a perimeter of the cylindrical body 234. The injection passages 236 are radially outward of the injection passages 238. Circles 402, 404 illustrate a foot print of the bottom surface 213 of the inlet hub 210 on the nozzle 230. The ring-shaped area between the circles 402, 404 correspond to the opening 220 of the inner volume 218 in the inlet hub 210. The injection passages 238, 236 are located within the ring-shaped area between the circles 402, 404.

Curve 404 illustrates a foot print of the distribution insert 250 according to one embodiment of the present invention. The distribution insert 250 separates and groups the injection passages 236, 238. The injection passages 236, 238 within each group share one outlet of the distribution passage in the distribution insert 250.

Figure 5A:
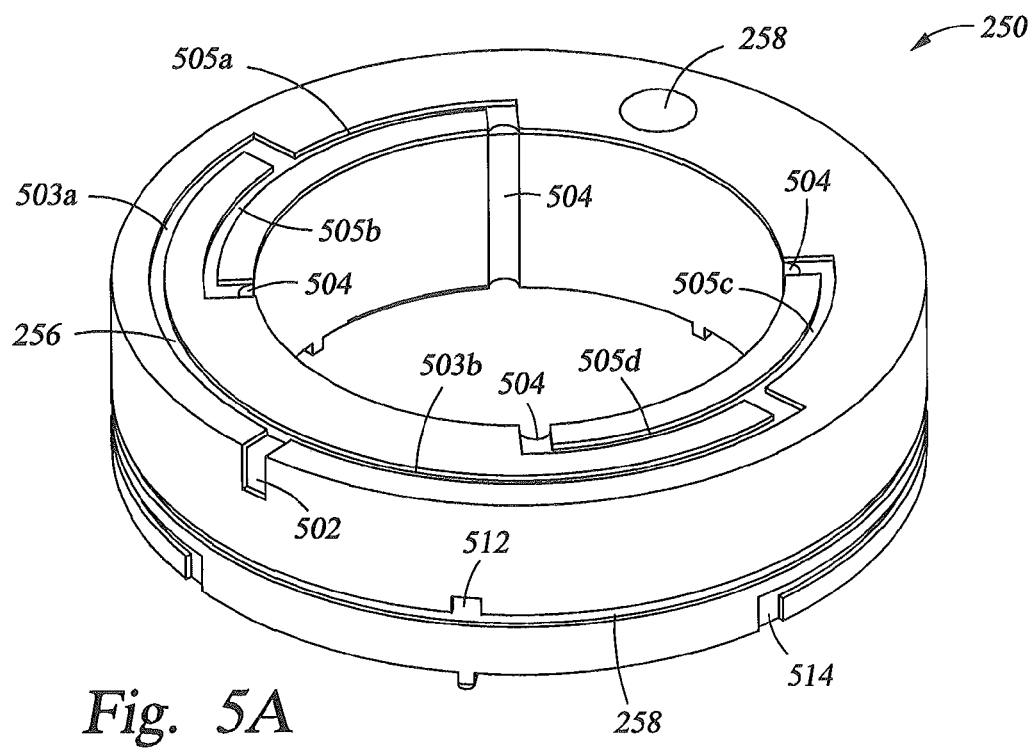
FIG. 5A is a schematic top perspective of a distribution insert according to one embodiment of the present invention.
Figure 5B:
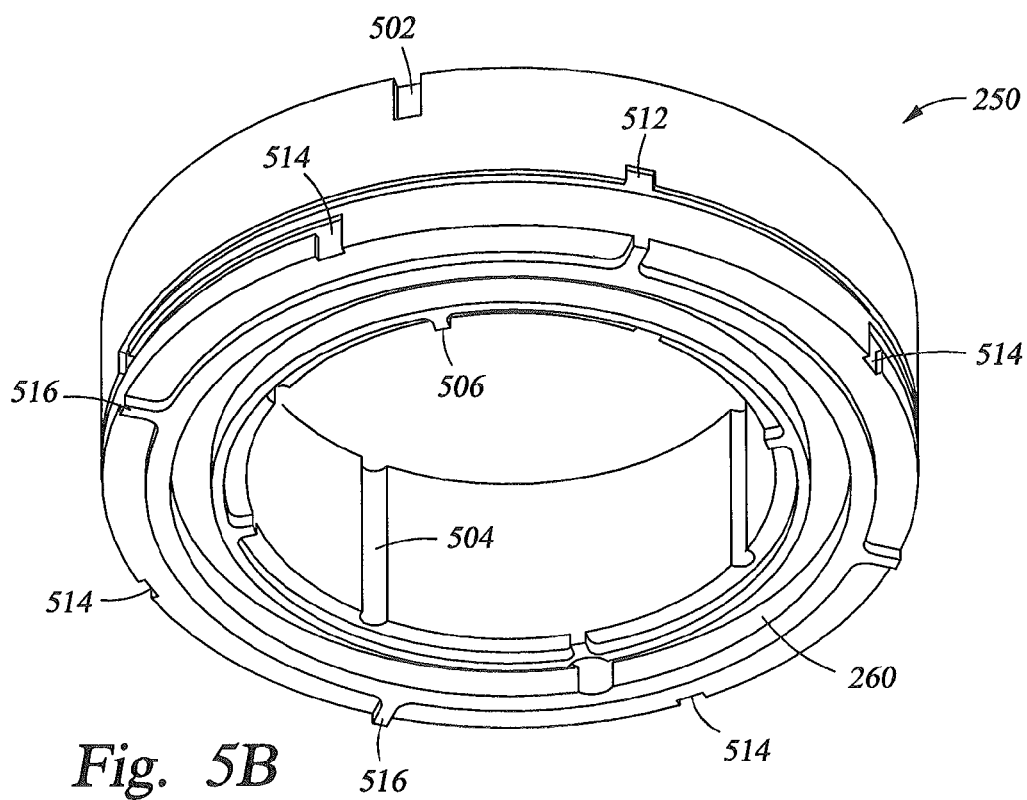
FIG. 5B is a schematic bottom perspective view of the distribution insert of FIG. 5A.

FIG. 5A is a schematic perspective view of the distribution insert 250 according to one embodiment of the present invention. FIG. 5B is another perspective view of the distribution insert 250. The distribution insert 250 has a ring-shaped body 252.

The distribution passage 256 includes one inlet 502 and a plurality of outlets 504. The plurality of outlets 504 may be evenly distributed along the circumference of the ring shaped body 252. The inlet 502 is configured to align with an inlet passage in the inlet hub 210. As shown in FIG. 5A, the distribution passage 256 bifurcates shortly after the inlet 502 to branches 503a, 503b. The branches 503a, 503b extend along the arc of the body 252 in opposite directions for the same length, then bifurcate to branches 505a, 505b and 505c, 505d respectively. The branches 505a, 505b extend along the arc of the body 252 in opposite directions for the same length, and connect with two of the outlets 504. The branches 505c, 505d extend along the arc of the body 252 in opposite directions for the same length, and connect with two of the outlets 504. Thus, the distances from the inlet 502 to each of the outlets 504 are equal. The passage 256 may be bifurcated further to connect with more outlets.

Similarly, the distribution passage 254 includes one inlet 512 and a plurality of outlet 514. The distribution passage 254 bifurcates twice from the inlet 512 to reach the outlets 514.

As shown in FIG. 5B, dividers 506, 516 may be formed on a bottom surface 518 of the ring-shaped body 252. When contacting the nozzle 230, the dividers 506, 516 may group the plurality of injection passages 236, 238 in multiple groups. The injection passages 236 within one group are connected with the same one of the plurality of outlets 504. The injection passages 238 within one group are connected with the same one of the plurality of outlets 514. The position of the dividers 506, 516 relative to the injection passages 236, 238 are shown in FIG. 4.

While the foregoing is directed to embodiments of the invention, other and further embodiments of the invention may be devised without departing from the basic scope thereof, and the scope thereof is determined by the claims that follow.

What is claimed is:

1. A gas injection assembly, comprising:
an inlet hub having an inner surface defining a ring-shaped recess;
a nozzle having a plurality of injection passages; and
a distribution insert disposed between the nozzle and the inlet hub, wherein the distribution insert has a ring-shaped body and is disposed in the ring-shaped recess of the inlet hub, first and second gas distribution passages includes channels formed between the distribution insert and the inner surface of the inlet hub, each of the first and second gas distribution passages connects the inlet hub to the plurality of the injection passages of the nozzle, the first gas distribution passage has one first inlet connecting with a plurality of first outlets, distances between the first inlet and each of the plurality of first outlets are substantially equal, the second gas distribution passage has one second inlet connecting with a plurality of second outlets, distances between the second inlet and each of the plurality of second outlets are substantially equal, the ring-shaped body has an inner wall at an inner diameter and an outer wall at an outer diameter, the plurality of first outlets are formed between grooves on the inner wall of the ring-shaped body and the inlet hub, and the plurality of second outlets are formed between grooves on the outer wall of the ring-shaped body and the inlet hub.

2. The gas injection of claim 1, wherein the ring-shaped body of the distribution insert has a bottom surface contacting the nozzle, and one or more dividers are formed on the bottom surface, and the one or more dividers group the plurality of injection passages to multiple groups.

3. The gas injection assembly of claim 1, wherein the inlet hub, the distribution insert and the nozzle are fabricated from ceramic.

4. The gas injection assembly of claim 1, wherein the inlet hub has an outer surface one or more inlet passages are formed in the inlet hub, and each of the one or more inlet passages has a first end open to the outer surface and a second end open to the inner surface.

5. The gas injection assembly of claim 4, wherein the nozzle is disposed against the inlet hub over an opening of the ring-shaped recess, the nozzle closes the ring-shaped recess of the inlet hub, and the plurality of injection passages connect ring-shaped recess of the inlet hub to an exterior volume.

6. The gas injection of claim 4, wherein the first and second inlet passages enter the ring-shaped recess at different vertical levels.

7. The gas injection assembly of claim 5, wherein each of the first inlet and second inlet is positioned to connect with the second end of a corresponding inlet passage of the inlet hub, and each of the plurality of first outlets and second outlets is open to one or more of the plurality of injection passages in the nozzle.

8. The gas injection assembly of claim 7, wherein each of the first and second gas distribution passages is bifurcated one or more times from the inlet to the plurality of outlets.

9. The gas injection assembly of claim 7, further comprising an aligning element configured to align the distribution insert with the inlet hub.

10. The gas injection assembly of claim 9, wherein the aligning element is a dowel pin.

11. The gas distribution assembly of claim 7, wherein the nozzle is a hollow cylinder having a cylindrical sidewall surrounding a central opening, and the plurality of injection passages are formed in the cylindrical sidewall.

12. The gas distribution assembly of claim 11, further comprising an observation window disposed between the inlet hub and the nozzle, wherein the inlet hub has a central opening radially inward of the ring-shaped recess, the central opening of the inlet hub and the central opening of the nozzle align with one another, and the observation window covers the central opening of the nozzle.

13. The gas distribution assembly of claim 11, wherein the plurality of injection passages comprises a plurality of inner injection passages and a plurality of outer injection passages, the plurality of inner injection passages open to a bottom end of cylindrical sidewall, and the plurality of outer injection passages open to an outer surface of the cylindrical sidewall.

14. The gas injection assembly of claim 1, wherein the plurality of outlets in each one of the first and second gas distribution passages are evenly distributed along a perimeter of the ring-shaped body of the distribution insert.

15. The gas injection assembly of claim 14, further comprising a springing element disposed between the nozzle and the distribution insert, wherein the spring element presses the distribution insert against the inner surface of the inlet hub.

16. The gas injection assembly of claim 15, wherein the springing element is a seal.

17. The gas injection of claim 16, wherein the seal is compressed to reduce about 10% to about 20% of its original size.

18. A substrate processing system, comprising:
a chamber housing assembly defining a processing volume, wherein the chamber housing assembly comprises a chamber lid having a central opening;
a substrate support disposed in the processing volume; and
a gas injection assembly disposed over the chamber lid, wherein the gas injection assembly comprises:
an inlet hub having an inner surface defining a ring-shaped recess;
a nozzle having a plurality of injection passages; and a distribution insert disposed between the nozzle and the inlet hub, wherein the distribution insert has a ring-shaped body and is disposed in the ring-shaped recess of the inlet hub, first and second gas distribution passages includes channels formed between the distribution insert and the inner surface of the inlet hub, each of the first and second gas distribution passages connects the inlet hub to the plurality of the injection passages of the nozzle, the first gas distribution passage has one first inlet connecting with a plurality of first outlets, distances between the first inlet and each of the plurality of first outlets are substantially equal, the second gas distribution passage has one second inlet connecting with a plurality of second outlets, distances between the second inlet and each of the plurality of second outlets are substantially equal, the ring-shaped body has an inner wall at an inner diameter and an outer wall at an outer diameter, the plurality of first outlets are formed between grooves on the inner wall of the ring-shaped body and the inlet hub, and the plurality of second outlets are formed between grooves on the outer wall of the ring-shaped body and the inlet hub, wherein a portion of the nozzle is positioned in the processing volume through the central opening in the chamber lid.

19. The substrate processing system of claim 18, wherein the nozzle of the gas injection assembly comprises a flange, and the flange rests on the chamber lid.

20. The substrate processing system of claim 18, further comprising an optical sensor disposed outside the processing volume and configured to monitor a substrate being processed through an observation window of the gas injection assembly.

* * * * *